United States Patent [19]

Pieper et al.

[11] Patent Number: 5,729,438
[45] Date of Patent: Mar. 17, 1998

[54] DISCRETE COMPONENT PAD ARRAY CARRIER

[75] Inventors: Kevin J. Pieper, Coral Springs; Mitra E. Geeban, Margate; Richard J. Kolcz, Davie, all of Fla.

[73] Assignee: Motorola, Inc., Schaumburg, Ill.

[21] Appl. No.: 660,389

[22] Filed: Jun. 7, 1996

[51] Int. Cl.$^6$ ...................................................... H05K 1/16
[52] U.S. Cl. ........................... 361/760; 361/762; 361/763; 361/765; 361/766; 361/767; 174/51; 174/52.1; 439/65; 439/76.1; 439/591
[58] Field of Search ..................... 361/760, 762, 361/763, 765, 766, 767, 768, 771, 772, 773, 777, 778, 738, 746; 174/51, 52.1; 439/65, 76.1, 591

[56] References Cited

U.S. PATENT DOCUMENTS

| | | | |
|---|---|---|---|
| 5,241,133 | 8/1993 | Mullen, III et al. | 174/52.4 |
| 5,504,277 | 4/1996 | Danner | 174/261 |
| 5,519,580 | 5/1996 | Natarajan et al. | 361/760 |
| 5,591,941 | 1/1997 | Acocella et al. | 174/266 |
| 5,642,265 | 6/1997 | Bond et al. | 361/809 |

*Primary Examiner*—Leo P. Picard
*Assistant Examiner*—David Foster
*Attorney, Agent, or Firm*—Dale W. Dorinski

[57] ABSTRACT

A pad array carrier module for packaging discrete electronic components is provided. A circuit substrate (8) contains component mounting pad pairs (20), each consisting of a power pad (22) and a ground pad (21), on a first side (10). Component mounting pads are electrically connected by circuit traces (23), through conductive vias (14), to terminal solder pads (16) on the second side (12) of the circuit substrate. Some of the ground pads are connected to a common ground solder pad (17). Likewise, some of the power pads are connected to a common supply voltage solder pad (19). Solder spheres (18) are attached to the solder pads. Discrete electronic components (24) are conductively coupled (26) to the component-mounting pad pairs.

29 Claims, 4 Drawing Sheets

DISCRETE COMPONENT PAD ARRAY CARRIER

TECHNICAL FIELD

This invention relates in general to discrete components, and particularly to discrete components having pad array carrier packages.

BACKGROUND

In the electronics industry, there is an on-going need to reduce circuit board size and manufacturing cost, while improving overall electrical and mechanical performance. In an effort to achieve these goals, there is a constant drive toward miniaturization of circuit board components; including discrete components such as resistors, capacitors, voltage regulators and diodes. Historically, discrete components (or discretes) have been individually mounted directly onto circuit board surfaces without much difficulty. However, as placement requirements associated with shrinking component sizes become increasingly demanding, placement-related defects rise. Such defects result in a direct increase in circuit board manufacturing cost.

One means of countering discrete placement-related defects is to combine multiple difficult-to-place components in single easy-to-place surface mount packages. For example resistor and capacitor networks are commercially available from a host of electronics suppliers. In comparison to individually-mounted discrete components, surface mount networks afford the advantages of reduced board space usage, improved performance and reliability, and lower part placement cost. Although known discrete network packaging technologies (e.g., SIPs, DIPs, and SOICs) provide a viable alternative to individual discrete part placement in some instances, limitations remain. For instance, pin count availability of resistor and capacitor networks in these molded leadframe-style packages is limited, restricting the quantity of discretes which may be combined in a single package. In addition, commercially available discrete networks provide for a series of either bussed or isolated discrete components, but not a combination of bussed and isolated discretes in a single package (see FIG. 1). A non-leadframe style electronic package commonly referred to as a "ball grid array" (or BGA) incorporates a pad array carrier substrate design which is more conducive to packaging larger quantities of discretes than available leadframe style packages. The general structure of BGA packages is well known to those skilled in the art, for example see U.S. Pat. No. 5,241,133. Unfortunately, because BGAs are semiconductor packages, they are specifically designed to carry integrated circuit (IC) components—not discrete components.

Furthermore, since plastic encapsulation is inherent to both of the prior art packaging structures mentioned above, neither allow for replacement of packaged components. Since encapsulation prevents the replacement of defective components, it would be more cost effective, when packaging large quantities of discretes in a single package, to provide a non-encapsulated package which would allow for discrete component replacement.

Accordingly, a need exists to provide a reliable, practical, cost-effective discrete network package capable of accommodating large quantities of discrete electronic components.

DETAILED DESCRIPTION OF THE EMBODIMENT

Figure 1:
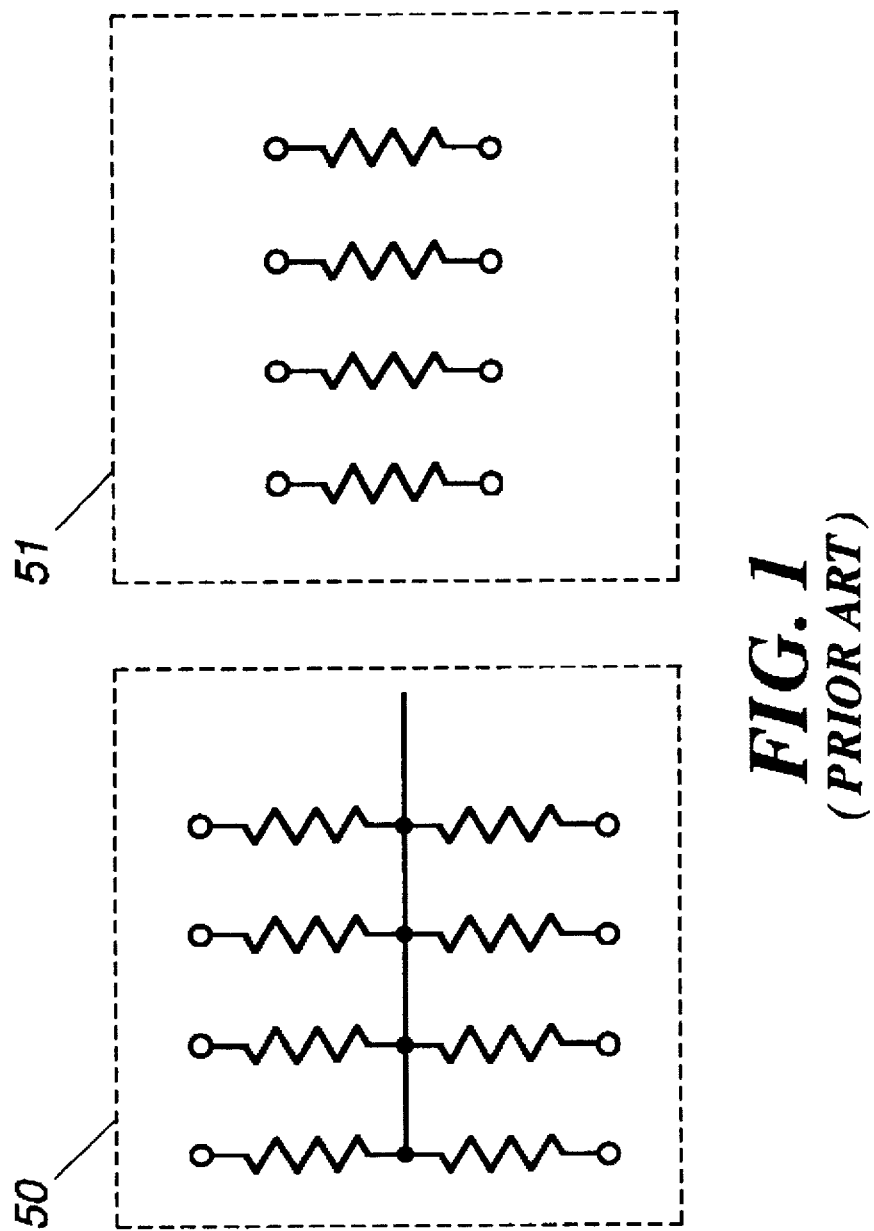
FIG. 1 illustrates two simplified circuit schematics, representing two general types of resistor networks, as practiced in the prior art.

While the specification concludes with claims defining the features of the invention that are regarded as novel, it is believed that the invention will be better understood from a consideration of the following description in conjunction with the drawing figures, in which like reference numerals are carried forward.

Figure 2:
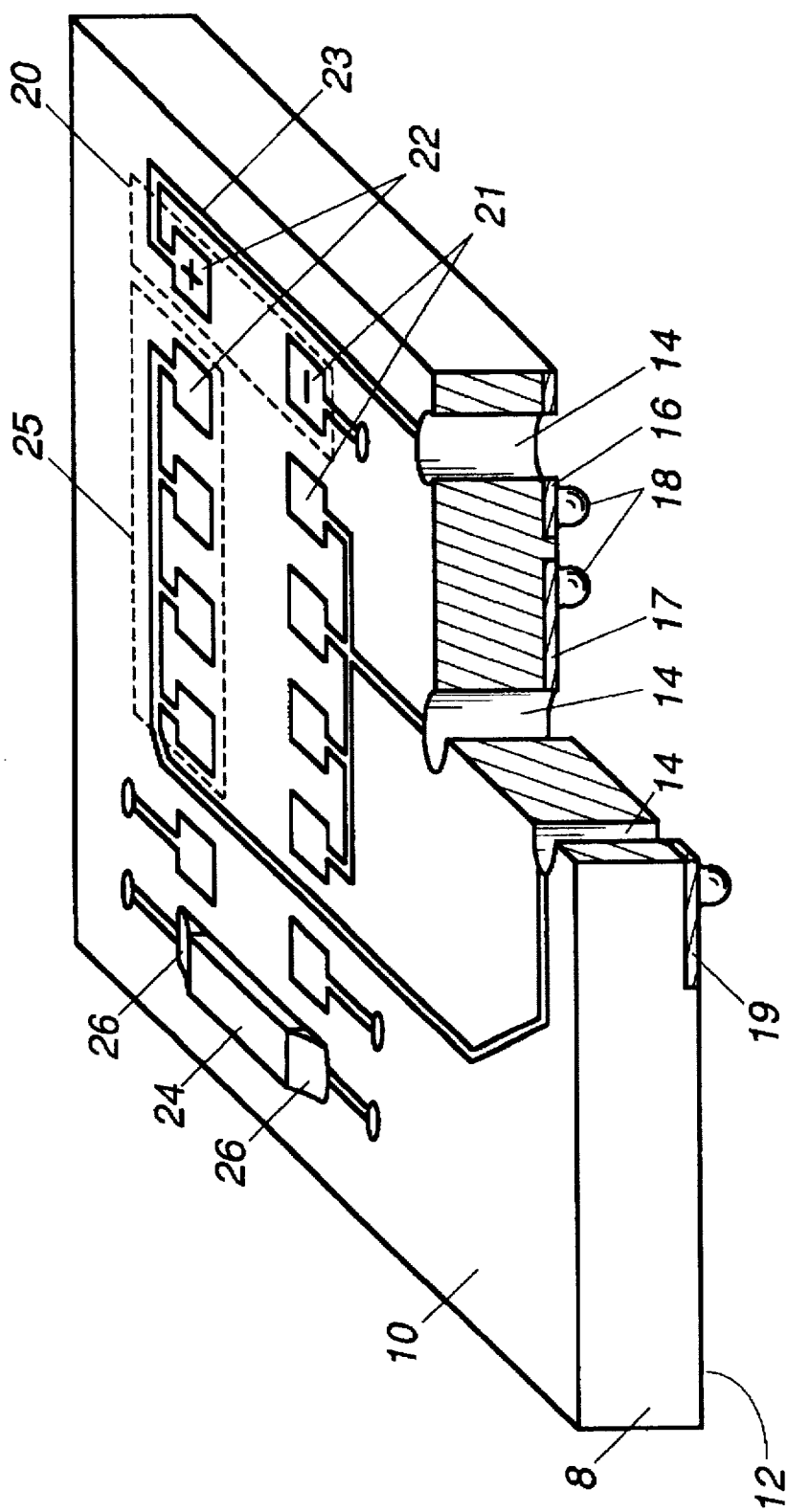
FIG. 2 is an isometric cut-away view of a pad array carrier substrate for mounting discrete components, in accordance with the present invention.

Shown in FIG. 2, is one embodiment of a discrete component network having a pad array carrier package. Circuit substrate 8 is provided as a carrier for a metallization pattern. The substrate material may be any one of a number of materials commonly used in the industry, such as polyester, polyimide, polyetherimide, polytetrafluoroethylene, glass-reinforced printed circuit board materials, metal, ceramic, or glass, and may be rigid or flexible. Substrate thickness may vary from approximately 0.001 inches to 0.250 inches, with thickness ranging from 0.005 to 0.075 inches being preferred.

The circuit substrate 8 has a first side 10 and a second side 12, electrically connected by a plurality of conductive vias 14. The metallization pattern on the first side has component-mounting pad pairs 20. Each pad pair consists of a power pad 22 and a ground pad 21. Where it is desirable to apply an individual supply voltage to a power pad, the power pad 22 may be electrically connected by a circuit trace 23 to a via 14 which terminates at a terminal solder pad 16 not electrically connected to any other power pads. Alternatively, multiple power pads 25 may be collectively connected to a common supply voltage solder pad 19. Similarly, ground pads may be electrically connected to individual solder pads or collectively connected to a common circuit ground solder pad 17. Solder spheres 18, attached to terminal solder pads 16, are formed from a lead-tin alloy having about a 60:40 lead-tin composition, or alternatively, a lead-tin-silver alloy having about a 62:36:2 composition or an indium alloy, or the like. Solder spheres are somewhat resilient and can absorb mechanical stress when circuit substrate 8 is mounted to a substrate such as a printed circuit board (PCB).

Non-semiconducting discrete components (or discretes) 24 are conductively coupled to pad pairs that are comparable to pad pairs 20. Here, "non-semiconducting" distinguishes the components of the present invention from integrated circuit (IC) package components. Unlike the package of the present invention, IC packages contain semiconducting materials such as Silicon or Gallium Arsenide. The term "conductively coupled" denotes the mechanical attachment of the component to the pad pair, such that the component electrically bridges the individual pads of the pair. For example, solder joints 26 may be formed to attach the component 24 ends to the individual pads of a pad pair. As would be obvious to those in the electronics industry, there are numerous solder compositions and soldering methods which could be employed to solder a discrete component onto a circuit board. Furthermore, a conductive epoxy material could be used to achieve a similar result. There are a variety of conductive epoxy compositions well known to those skilled in the art. Typically, conductive epoxies are comprised of polymer resins which have been made conductive by the addition of a metal powder, such as silver, copper or gold. Alternatively, any of a number of thick film processes could be used to form discrete components across pad pairs. Formation of thick film discretes—especially thick film resistors and capacitors—are well known to those skilled in the art.

Figure 3:
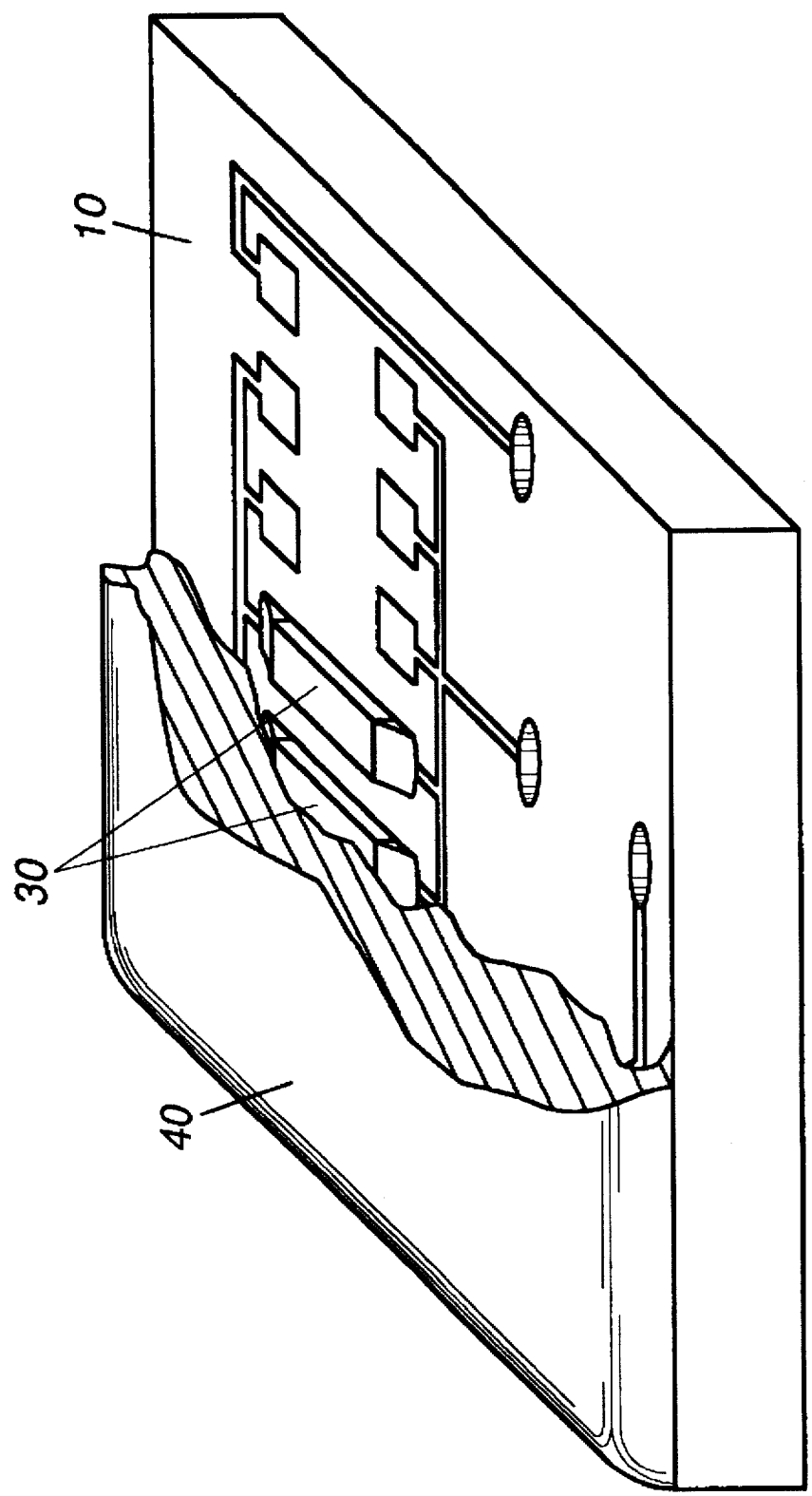
FIG. 3 is an isometric cut-away view of discrete components mounted on a pad array carrier substrate with a protective molding compound, illustrating an alternate embodiment of the present invention.

Referring now to FIG. 3, another embodiment of the invention, further comprising a protective means 40 for the discrete components 30 and circuitry, is shown. In lieu of leaving the circuit substrate first side 10 discrete components and circuitry physically exposed to the surrounding environment, an encapsulating resin is either transfer molded or glob topped over the first side of the circuit substrate. In the case of transfer molding, the assembly is placed into a transfer mold and a thermoplastic or thermoset transfer molding compound is molded around the discrete components to form a solid mass. The transfer molding compound totally encapsulates the discretes and portions of the metallization pattern and substrate. The techniques and equipment for transfer molding are well known to those skilled in the art, for example in U.S. Pat. No. 4,822,550. In the case of glob top encapsulation, a thermoset material is placed over the first side of the circuit substrate, and heated in an oven to flow out and encapsulate the components and circuitry requiring protection. The heating cycle also cures the material to form a hard, monolithic material that protects the underlying components and circuitry from environmental damage. Although encapsulation is the only means of protection illustrated here, this is not the only method of protection contemplated and is not meant to be limiting. Other protection means—such as providing a cover—are well known to those skilled in the art and are clearly contemplated by the instant invention.

Figure 4:
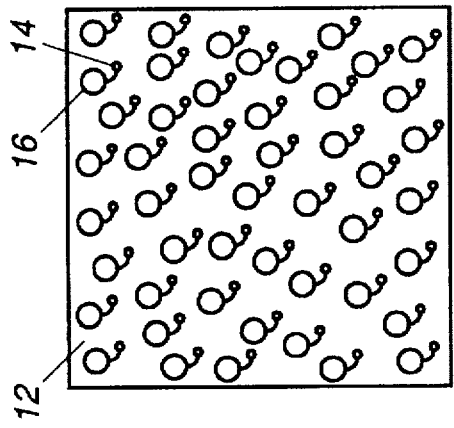
FIG. 4 is a plan view of an alternate embodiment of the present invention, illustrating a regularly-spaced array of terminal solder pads on the second side of a pad array carrier substrate.
Figure 5:
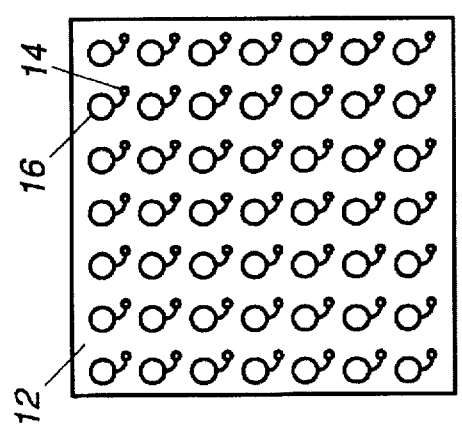
FIG. 5 is a plan view of an irregularly-spaced array of terminal solder pads on the second side of a pad array carrier substrate.

Referring now to FIG. 4, it is preferred that the terminal solder pads 16 of the present invention be arranged in a regularly-spaced array. Here, "regularly-spaced array" denotes the structure of the array, wherein solder pads are arranged such that the center-to-center pitch between adjacent solder pads is substantially the same. Conversely, an "irregularly spaced array," as shown in FIG. 5, has a non-uniform pad-to-pad pitch between adjacent solder pads. In either case, regardless of the solder pad arrangement, the terminal solder pads 16 on the second side 12 of the circuit substrate are displaced away from the vias 14 such that the vias never occupy the same area as a solder pad. Referring back to FIG. 4, although the vias 14 are shown in the drawing to be equidistant from the respective solder pads 16, the distances that the vias are displaced away from the centers of the respective attached solder pads are not necessarily uniform. Similarly, although the drawing depicts an array of solder pads with an equal number of rows and columns (i.e., 7×7), a "regular array" may have an unequal number of solder pad rows and columns. Furthermore, although the total number of solder pads in the array may range from 4 to 300+pads, it is preferred that the array of the present invention contain in the range of 50 to 100 solder pads.

Figure 6:
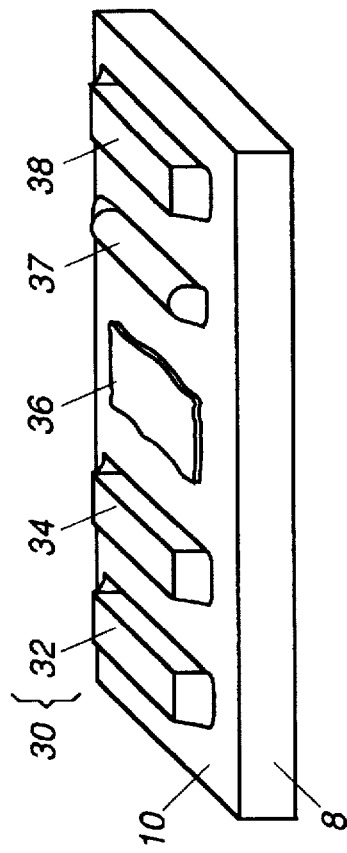
FIG. 6 is a perspective view illustrating the variety of discrete components which may be mounted on the substrate, in accordance with the present invention.

Referring now to FIG. 6, some of the discrete components 30 contemplated by the instant invention are shown. In one embodiment of the invention, the discrete components consist solely of leadless resistors 32, forming a resistor network on the first side 10 of the circuit substrate 8. In another embodiment of the invention, the discrete components consist solely of leadless capacitors 34 forming a capacitor network on the first side of the circuit substrate. In still a further embodiment of the invention, the discrete components consist of a combination of leadless resistors 32 and leadless capacitors 34, forming a resistor-capacitor network on the first side of the circuit substrate. Alternatively, thick film discretes 36, such as thick film resistors and capacitors, may be formed on the first side of the circuit substrate. The leadless discrete components 30 are not restricted in their shape to rectangular components 38; for example, they could comprise cylindrical-shaped leadless components 37. Though the preferred embodiment of the present invention focuses upon the use of leadless resistors and capacitors, other leaded and leadless discretes, such as diodes and voltage regulators, are clearly contemplated.

Accordingly, this invention provides a number of advantages. The discrete network of the present invention has improved design flexibility. As shown in FIG. 1, commercially available resistor networks are available with either electrically bussed resistors 50 or electrically isolated resistors 51. Conversely, the discrete network package of the present invention allows for a mixture of bussed and isolated resistors.

In comparison to commercially available discrete network packages, the present invention provides a discrete network with greatly improved component carrying capacity. For example, the highest I/O package offered by Bourns, Inc., a well-known supplier of discrete networks, is a 20-pin small outline package (SOP) resistor network (Newark Electronics Catalog #114, pp. 246–48). In contrast, discrete networks constructed in pad array carrier packages, in accordance with the present invention, provide for upwards of 300 I/Os. In addition to higher pin counts, pad array carrier packages provide greatly improved component packaging efficiency—by design, pad array carrier packages provide greater pinouts per packaging area than leaded devices such as SOPs.

Along with the increase in the quantity of discretes that may be combined in a single package, there is a corresponding decrease in the number of part placements per board—reducing the potential for defective part placement. Additional DPU reduction results, since pad array carrier packages are less prone to placement error than discrete components and leaded surface mount devices. Furthermore, eliminating component encapsulation where large quantities of discretes are combined makes defective component replacement feasible; preventing the need to scrap entire multicomponent packages.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A ball grid array module with non-semiconductor discrete electronic components, comprising:

a circuit substrate having opposing first and second sides electrically connected by a plurality of conductive vias in said substrate, and terminal solder pads on the second side, displaced away from said vias and connected to the vias;

a plurality of component-mounting pad pairs disposed on said first side, each of said pad pairs consisting of a ground pad and a power pad, said power pads connected to the vias by a circuit trace;

some of the ground pads on said first side electrically connected to a circuit ground solder pad on said second side by one or more of the vias;

some of the power pads on said first side electrically connected to a supply voltage solder pad on said second side by one or more of the vias;

solder spheres attached to said terminal solder pads;

a plurality of discrete components, each component conductively coupled to a component-mounting pad pair, all of said discrete components being non-semiconducting: and wherein an integrated circuit is not attached to said circuit substrate.

2. The ball grid array module of claim 1, wherein said discrete components are soldered to said component-mounting pad pairs.

3. The ball grid array module of claim 1, wherein said discrete components are leadless.

4. The ball grid array module of claim 1, wherein said circuit substrate consists of a glass-reinforced printed circuit board material.

5. The ball grid array module of claim 1, wherein said circuit substrate consists of a flexible film material.

6. The ball grid array module of claim 1, wherein said discrete components have mixed electrical values.

7. The ball grid array module of claim 1, wherein said discrete components are either rectangular or cylindrical in shape.

8. The ball grid array module of claim 1, wherein said discrete components consist of thick film components.

9. The ball grid array module of claim 1, further comprising a protection means overlying at least the discrete components on said substrate first side.

10. The ball grid array module of claim 1, wherein said discrete components are substantially exposed.

11. The ball grid array module of claim 1, wherein said discrete components are uniformly spaced.

12. The ball grid array module of claim 1, wherein said terminal solder pads are arranged in a regularly-spaced array.

13. The ball grid array module of claim 1, wherein at least 10 terminal solder pads are disposed on said circuit substrate second side.

14. The ball grid array module of claim 1, wherein between 10 and 100 terminal solder pads are disposed on said circuit substrate second side.

15. The ball grid array module of claim 1, wherein between 100 and 250 terminal solder pads are disposed on said circuit substrate second side.

16. A ball grid array printed circuit board resistor network module, comprising:

a printed circuit board having opposing first and second sides electrically connected by a plurality of conductive vias in said printed circuit board, and terminal solder pads on the second side, displaced away from said vias and connected to the vias;

a plurality of component-mounting pad pairs disposed on said first side, each of said pad pairs consisting of a ground pad and a power pad, said power pads connected to the vias by a circuit trace;

some of the ground pads on said first side electrically connected to a circuit ground solder pad on said second side by one or more of the vias;

some of the power pads on said first side electrically connected to a supply voltage solder pad on said second side by one or more of the vias;

solder spheres attached to said terminal solder pads;

a plurality of leadless resistors, each resistor conductively coupled to a component-mounting pad pair, all of said leadless resistors being non-semiconducting: and wherein an integrated circuit is not attached to said circuit substrate.

17. The ball grid array module of claim 16, wherein said leadless resistors are soldered to said component-mounting pad pairs.

18. The printed circuit board module of claim 16, wherein said resistors have mixed resistance values.

19. The printed circuit board module of claim 16, wherein said leadless resistors consist of thick film resistors.

20. The printed circuit board module of claim 16, further comprising a protection means overlying at least the resistors on said first side.

21. The printed circuit board module of claim 16, wherein said leadless resistors are substantially exposed.

22. The printed circuit board module of claim 16, wherein between 10 and 100 terminal solder pads are disposed on said printed circuit board second side.

23. A ball grid array printed circuit board capacitor network module, comprising:

a printed circuit board having opposing first and second sides electrically connected by a plurality of conductive vias in said printed circuit board, and terminal solder pads on the second side, displaced away from said vias and connected to the vias;

a plurality of component-mounting pad pairs disposed on said first side, each of said pad pairs consisting of a ground pad and a power pad, said power pads connected to the vias by a circuit trace;

some of the ground pads on said first side electrically connected to a circuit ground solder pad on said second side by one or more of the vias;

some of the power pads on said first side electrically connected to a supply voltage solder pad on said second side by one or more of the vias;

solder spheres attached to said terminal solder pads;

a plurality of leadless capacitors, each capacitor conductively coupled to a component-mounting pad pair, all of said capacitors being non-semiconducting: and wherein an integrated circuit is not attached to said circuit substrate.

24. The ball grid array module of claim 23, wherein said leadless capacitors are soldered to said component-mounting pad pairs.

25. The printed circuit board module of claim 23, wherein said capacitors have mixed resistance values.

26. The printed circuit board module of claim 23, wherein said leadless capacitors consist of thick film capacitors.

27. The printed circuit board module of claim 23, further comprising a protection means overlying at least the capacitors on said first side.

28. The printed circuit board module of claim 23, wherein said leadless capacitors are substantially exposed.

29. The printed circuit board module of claim 23, wherein between 10 and 100 terminal solder pads are disposed on said printed circuit board second side.

* * * * *